United States Patent [19]
Garroway et al.

[11] Patent Number: 6,054,856
[45] Date of Patent: Apr. 25, 2000

[54] MAGNETIC RESONANCE DETECTION COIL THAT IS IMMUNE TO ENVIRONMENTAL NOISE

[75] Inventors: Allen N. Garroway, Fort Washington, Md.; Bryan H. Suits, Houghton, Mich.; Joel B. Miller, Cheverly, Md.

[73] Assignee: The United States of America as represented by the Secretary of the Navy, Washington, D.C.

[21] Appl. No.: 09/053,065
[22] Filed: Apr. 1, 1998
[51] Int. Cl.[7] ............................................. G01V 3/00
[52] U.S. Cl. .................. 324/318; 324/322; 324/309; 600/407
[58] Field of Search ........................... 324/322, 318, 324/248, 303, 309, 247, 326, 245, 260, 346; 356/345; 600/407

[56] References Cited

U.S. PATENT DOCUMENTS

| | | | |
|---|---|---|---|
| 4,079,730 | 3/1978 | Wikswo et al. | 128/2.05 |
| 4,816,766 | 3/1989 | Zabel et al. | 324/318 |

*Primary Examiner*—Christine K. Oda
*Assistant Examiner*—Brij B. Shrivastav
*Attorney, Agent, or Firm*—Barry A. Edelberg; John J. Karasek

[57] ABSTRACT

A noise immune gradiometer split shield coil for use in magnetic resonance detection, such as in Nuclear Magnetic Resonance (NMR) and Nuclear Quadrupole Resonance (NQR). The coil is formed by a transmission line configured as a magnetic field gradiometer. The transmission line has a conductor which is electrically continuous through the coil, and a shield which is split at a position that causes the gradiometer to be electrically balanced. In this manner, the coil provides a high degree of internal shielding to reduce the effects of environmental noise pick-up. Such coils are also less sensitive to the effects of nearby conducting media.

24 Claims, 4 Drawing Sheets

MAGNETIC RESONANCE DETECTION COIL THAT IS IMMUNE TO ENVIRONMENTAL NOISE

BACKGROUND OF THE INVENTION

1. Field of the Invention

The present invention relates to a coil for detecting a magnetic resonance signal induced in a sample and, more particularly, to a coil that is immune to environmental noise and also, is less sensitive to the effects of nearby electrically conducting media.

2. Description of the Related Art

Magnetic resonance is useful to detect the presence of a specific substance in a sample. For example, generally, radio frequency (RF) radiation at a particular frequency will induce a magnetic resonance signal in a specific substance, but not in other substances. Therefore, the induced magnetic resonance signal can be detected to thereby indicate the presence of the specific substance.

It is common to detect a magnetic resonance signal by placing a sample to be measured in a tuned, electronically resonant tank circuit. Then, the response of the tank circuit to the electromotive force produced by nuclear or electronic spins in the sample is measured. With Nuclear Magnetic Resonance (NMR) or Nuclear Quadrupole Resonance (NQR), the sample is placed in or near an inductor, commonly referred to as a coil, that detects AC magnetic fields. The inductance of the coil is tuned with a parallel and/or series capacitance to make the circuit electrically resonant at the measurement frequency. One or more additional reactive impedances (inductors or capacitors) are typically added to adjust the resistive impedance at resonance to a particular value which optimizes the detection sensitivity.

FIG. 1 is a diagram illustrating an example of a conventional magnetic resonance apparatus. Referring now to FIG. 1, a transmitter 20 and a receiver 22 are connected to a probe 24 through a transmit/receive (T/R) switch 26. Probe 24 includes a coil 28, forming part of a resonant, tuned tank circuit with various other inductors L and capacitors C. To detect the presence of a target substance, T/R switch 26 connects transmitter 20 to probe 24 while disconnecting receiver 22 from probe 24. Then, transmitter 20 generates a pulse and supplies the pulse to probe 24. As an example, in NQR, the pulse is formed from an RF signal having a frequency corresponding to the resonance signal of the target substance which is intended to be detected. Probe 24 receives the pulse, which causes coil 28 to store (RF) energy.

If a sample (not illustrated) is appropriately placed near or inside coil 28, the stored RF energy will cause a corresponding RF magnetic field to irradiate the sample. If the sample includes the target substance, the RF magnetic field will induce a magnetic resonance signal in the target substance. For example, if the apparatus operates under the principles of NMR, then an appropriate NMR resonance signal will be induced. If the apparatus operates under the principles of NQR, then an appropriate NQR resonance signal will be induced.

After the sample is irradiated with the RF magnetic field, T/R switch 26 connects receiver 22 to probe 24 while disconnecting transmitter 20 from probe 24. Coil 28 then detects the resonance induced in the target substance, and probe 24 produces a corresponding output signal. The output signal of probe 24 is received and analyzed by receiver 22, to confirm the presence and/or measure the quantity of the target substance in the sample.

FIG. 1 is only one example of a magnetic resonance apparatus. For example, FIG. 1 illustrates T/R switch 26 to connect transmitter 20 and receiver 22 to the same probe 24. However, instead, a transmitter and receiver can each have a separate, dedicated probe together with a switch or gate for protecting the receiver while the transmitter is ON.

FIG. 2 is a diagram illustrating a simple, conventional coil which can be used in a probe. Referring now to FIG. 2, a coil 29 typically forms a loop. Typically, a tuning capacitance C and a matching capacitance C' are also provided.

In magnetic resonance the signal-to-noise ratio (SNR) is determined, in part, by the noise contributions and the quality factor (Q) of the receiver coil. It is well-known that random thermal noise contributions typically arise from Johnson noise in the RF inspection coil and the first amplifier in the receiver. A further noise contribution is from extraneous environmental noise.

It is also well-known in magnetic resonance that the Q of a receiver coil is determined not only by resistive loss in the windings of coil itself but also by loss in nearby electrically conducting samples that can dissipate energy from the receiver coil. As the SNR typically varies as $Q^{1/2}$, such electrical loss in the sample leads to a reduction in SNR. For example, in MRI, the main source of electrical loss can come from the patient, and not the receiver coil windings, as the water in the body has an electrical conductivity comparable to sea water. In NQR landmine detection it is found that wet soils also present significant electrical loading to the receiver coil, leading to a decreased coil Q and decreased SNR.

In many applications in MRI and also landmine detection, a surface coil is used for the inspection. The larger the surface coil, the more the receiver Q is decreased. Indeed, in MRI, a system designer conventionally chooses as the receiver coil the smallest surface coil that will "cover" the region of interest.

For a conventional simple circular coil of radius R on the surface of a large conducting volume, we find that approximately 65% of the electrical loss from this volume arises from regions that are deeper than a distance R below the surface. However, because the RF magnetic field falls off so rapidly with distance, this coil is very inefficient at receiving NMR or NQR signals much beyond a distance R. Hence, most of the loss comes from a region beyond the actual region that can be imaged (in MRI) or inspected (in NQR landmine detection).

Accordingly, it is desired to reduce the environmental noise pickup and reduce the electrical loss due to the proximity of a conducting medium. Approaches for achieving this may employ detector (or transmitter) coils that create electromagnetic fields designed to (i) reject electromagnetic environmental noise that does not vary across the dimensions of the coil and (ii) to couple strongly to signals that arise near the surface of a sample, and more weakly with those deeper inside a sample.

In most NQR, NMR and EPR applications, a common coil would typically be used as both a receiver coil and a transmitter coil, though this is not essential. In MRI separate coils would typically be used.

Even though the RF coil used as a detector in magnetic resonance is not at all optimized for the detection of radio signals, nonetheless the detection coil can act as a (rather inefficient) radio receiving antenna. This radio interference, either from radio stations, or other RF noise in the relevant frequency range can easily overwhelm the magnetic resonance signals of interest. Therefore, conventionally, an external RF shield is used to surround the coil to prevent such radio signals or other electrical and magnetic environmental noise from being picked up by the coil. Unfortunately, an external RF shield is impractical in many applications, and can also increase the cost and size of a system.

There are two main strategies to remove external interference: shielding that prevents the offending interference from entering the detection coil and 'balancing' in which the interference enters but is arranged to cancel itself based on some property of the detection coil and the external interference. A gradiometer is one example of the latter approach.

In principle, a gradiometer can be designed to respond to any order of the spatial derivative of the electric or magnetic field. Here we concentrate on a conventional (linear or first order) gradiometer, that is (primarily) sensitive to the first derivative of the field, and correspondingly insensitive to the component that does not vary. Hence such a conventional gradiometer provides a means to cancel fields that have wavelengths much larger than the characteristic size of the gradiometer, thereby reducing noise pickup from distant sources. (For example, the free space wavelength of a 1 MHz signal is 300 meters.). Generally, a conventional (linear) magnetic field gradiometer is formed of two loops which are spatially removed from each other and have currents flowing in opposite directions.

FIG. 3 is a diagram illustrating a conventional magnetic field gradiometer. Referring now to FIG. 3, a conventional magnetic field gradiometer has a conductor 30 which forms two loops 32 and 34 wound in the opposite sense. That is, the direction of the current changes in coils 32 and 34, so that magnetic fields generated by coils 32 and 34 are opposite each other.

While a conventional magnetic field gradiometer may reduce environmental magnetic field noise pick-up, the amount of reduction is often not enough for many applications. Therefore, an external RF shield must often be used with a conventional magnetic field gradiometer to reduce environmental electrical noise pick-up.

Instead of using an external RF shield, various conventional coil designs reduce environmental noise pick-up by providing "internal" shielding. Here, internal shielding refers to the coil being electrically balanced to cancel out electrical noise. It has long been known that such electrical balancing can reduce the interaction between the coil and electric fields from its surroundings, so that there is no net electric dipole formed between the coil and the surroundings.

A Stensgaard split-shield resonator coil is a type of coil which provides internal shielding to reduce environmental noise pick-up from electric fields.

FIG. 4 is a diagram illustrating a Stensgaard split-shield resonator coil. Referring now to FIG. 4, a coaxial cable 36 has a center conductor 38 and a shield 40, and forms a loop. Shield 40 is split at a position 42 half way around the loop. An RF feed is provided via center conductor 38. The resulting currents which flow on the outside of shield 40 are automatically electrically balanced due to geometry. Connecting portion 43 indicates that the shield 40 of each end of transmission line 36 is connected together near the feed point. A tuning capacitance C, a matching capacitance C' and a terminating impedance Z are typically used. This type of split-shield resonator is considered to be an optimized, internally shielded (that is, self-shielded) loop resonator, and is well suited for NMR medical imaging applications.

From measurements performed by the inventors of the present invention with a 20 cm diameter version of a Stensgaard split-shield resonator coil, the noise level without external RF shielding was approximately 20 to 25 dB larger than the noise level with external RF shielding. Further, the noise without RF shielding could not be significantly reduced with additional shielding from external electric fields. This result indicates that while the Stensgaard split-shield resonator removes electrical noise pick-up, it is still prone to magnetic interference.

SUMMARY OF THE INVENTION

Accordingly, it is an object of the present invention to provide a novel coil design which significantly reduces both electric field noise pickup and magnetic field noise pickup, without requiring the use of an external RF shield.

Additional objects and advantages of the invention will be set forth in part in the description which follows, and, in part, will be obvious from the description, or may be learned by practice of the invention.

Objects of the present invention are achieved by providing a coil which includes a transmission line having first and second ends. The conductor of the transmission line is electrically continuous from the first to the second end. The shield of the transmission line is split at a position between the first and second ends to cause the coil to be electrically balanced and to define first and second sections in series which together have a geometric configuration so that a uniform magnetic field through the coil induces currents in each section with the sum of those currents being substantially less than the current flowing in either section.

Objects of the present invention are also achieved by providing a coil which includes a transmission line forming first and second loops in series between the ends of the transmission line. The first and second loops together have a geometric configuration so that a uniform magnetic field through the coil induces currents in each loop with the sum of those currents being substantially less than the current flowing in either loop. The conductor is electrically continuous through the transmission line. The shield is split at a position between the first and second loops to cause the coil to be electrically balanced.

Moreover, objects of the present invention are achieved by providing a coil which includes a transmission line configured as a magnetic field gradiometer. The conductor of the transmission line is electrically continuous through the coil. The shield of the transmission line is split at a position which causes the magnetic field gradiometer to be electrically balanced.

BRIEF DESCRIPTION OF THE DRAWINGS

These and other objects and advantages of the invention will become apparent and more readily appreciated from the following description of the preferred embodiments, taken in conjunction with the accompanying drawings of which.

DESCRIPTION OF THE PREFERRED EMBODIMENTS

Figure 1:
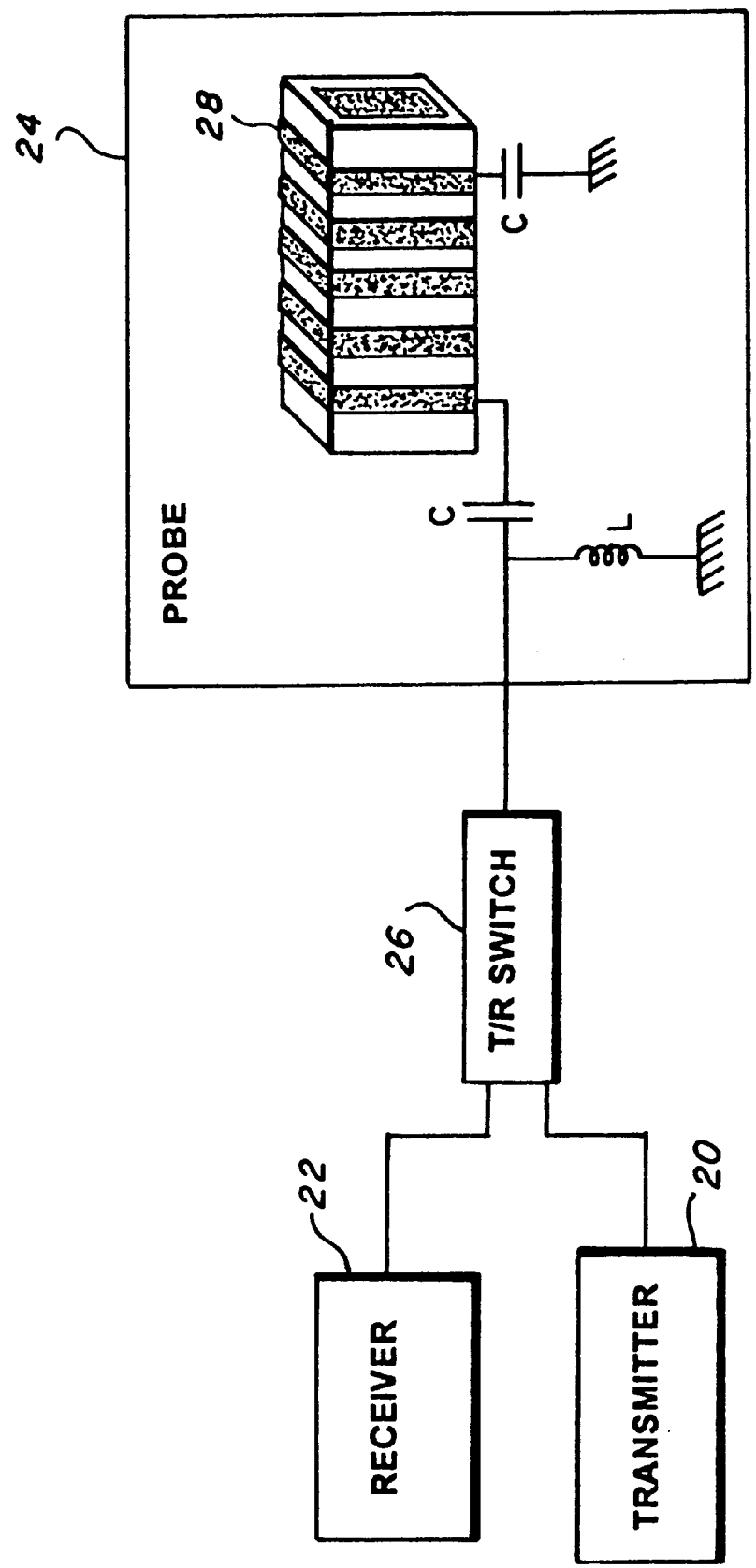
FIG. 1 (prior art) is a diagram illustrating an example of a conventional magnetic resonance apparatus.
Figure 2:
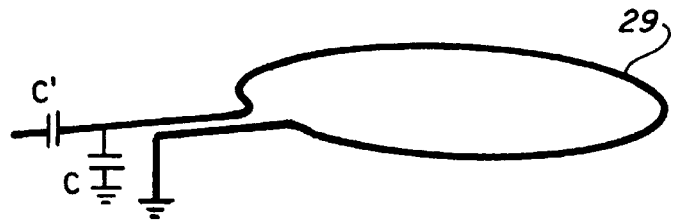
FIG. 2 (prior art) is a diagram illustrating a simple, conventional surface coil.
Figure 3:
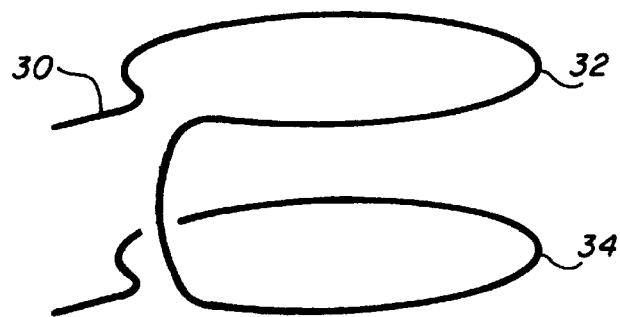
FIG. 3 (prior art) is a diagram illustrating a conventional magnetic field gradiometer.
Figure 4:
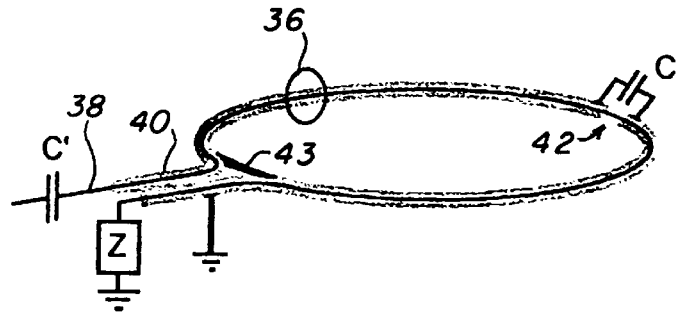
FIG. 4 (prior art) is a diagram illustrating a Stensgaard split-shield resonator coil.

Reference will now be made in detail to the present preferred embodiments of the present invention, examples of which are illustrated in the accompanying drawings, wherein like reference numerals refer to like elements throughout.

Figure 5:
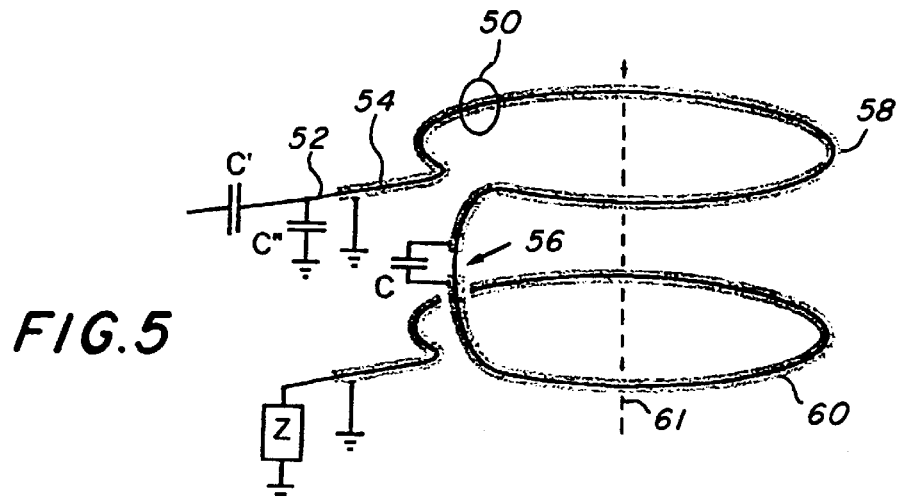
FIG. 5 is a diagram illustrating a noise immune gradiometer split-shield coil, according to an embodiment of the present invention.

FIG. 5 is a diagram illustrating a noise immune gradiometer split-shield coil, according to an embodiment of the present invention. Referring now to FIG. 5, a transmission line 50, such as a coaxial cable, has a conductor 52 and a shield 54.

Conductor 52 is electrically continuous through transmission line 50. That is, current flows through conductor 52. Thus, conductor 52 can be broken or split, as long as the break or split is electrically connected back together via, for example, a capacitor.

Shield 54 is split at a position 56 to cause the coil to be electrically balanced. Here, the term "split" refers to shield 54 being physically split and electrically reconnected, preferably with a capacitor.

The split in shield 54 defines first and second sections 58 and 60 in series, and which together form a magnetic field gradiometer having a geometry which reduces magnetic field noise pick-up. Therefore, generally, first and second sections 58 and 60 create magnetic fields in the opposite sense. First and second sections 58 and 60 together have a geometric configuration so that a uniform magnetic field through the coil induces currents in each section with the sum of those currents being substantially less than the current flowing in either section. Here, a uniform magnetic field through the coil could be, for example, that caused by radio signals emitted by distant radio stations.

Preferably, the sum of the currents in first and second sections 58 and 60 is less than 20% of the current flowing in either section, and is more preferably less than 10% of the current flowing in either section.

FIG. 5 also illustrates a tuning capacitance C, a matching capacitance C', an additional tuning capacitance C", and a terminating impedance Z. These capacitors can be fixed or variable.

Each of first and second sections 58 and 60 acts as an individual coil whose geometry is optimized for generating and detecting magnetic fields in a volume of interest. In some applications, such a coil could simply be a straight conductor, or a coil of the meanderline design. However, more typically, each of first and second sections 58 and 60 forms a loop which may be in the shape of a circle, an oval, a rectangle, or a square. Many such loop geometries are possible and are not limited to the recited list, nor are they required to be planar. Each loop can have a plurality of turns, and the present invention is not intended to be limited to loops having any specific number of turns. However, in many applications, it would be desirable to have a low number of turns to thereby provide a relatively high Q.

Transmission line 50 can be any type of transmission line, such as, for example, coaxial cable, stripline, or a twin lead type. Thus, the present invention is not intended to be limited to any specific type of transmission line.

In FIG. 5, first and second sections 58 and 60 have a common axis 61. Therefore, transmission line 50 is configured as an "axial" gradiometer. However, it is not necessary for first and second sections 58 and 60 to share a common axis. For example, instead of having a common axis, first and second sections 58 and 60 can be in the same plane, to thereby form a "planar" gradiometer. The noise pick-up of one section should be 180° out of phase with the noise pick-up of the other section, so that noise is canceled while still enabling a signal to be observed.

In FIG. 5, shield 54 is shown as being split in only one place. In some applications, it may be possible to split shield 54 in more than one place. This may cause phase shifts, which may be useful. However, the splits should be positioned to cause the coil to be electrically balanced.

The coil in FIG. 5 significantly reduces environmental noise pick-up by reducing both electric field noise pick-up and magnetic field noise pick-up. More specifically, the split in shield 54 causes the coil to be electrically balanced, thereby reducing electric field noise pick-up. The geometric configuration of first and second sections 58 and 59 formed by transmission line 50 causes the coil to be magnetically balanced, thereby reducing magnetic field noise pick-up. In effect, the coil is insensitive to uniform magnetic and electric fields, but is sensitive to gradients of magnetic fields.

Generally, the coil in FIG. 5 combines the geometrically determined electrical balance of a Stensgaard split shield resonator coil (which reduces electrical field noise pick-up) with a magnetic field gradiometer approach (which reduces magnetic field noise pick-up). With this combination, the noise level measured in the laboratory (using a sensitive NQR spectrometer) by the inventors of the present invention without external RF shielding was found to be only about 1 to 2 dB larger than the noise with highly effective external shielding. In addition, the magnetic resonance signals could be produced and detected using this coil with only a slightly reduced sensitivity compared to a more traditional coil of the same diameter. The reduction in the noise level more than compensates for the loss in sensitivity when the coil is used without electrical shielding.

It is common practice to use a single coil for both excitation and detection of magnetic resonance signal, and the coil in FIG. 5 can be used for both of these purposes. As the coil is a gradient design having first and second conducting sections 58 and 60 electrically connected to minimize noise pick-up during detection, it may be advantageous in some circumstances to break (or otherwise modify) the connection between first and second sections 58 and 60 during the excitation when noise pick-up is not an issue. For example, by using only one of first and second sections 50 and 60 for excitation, the RF power level needed for excitation can be reduced. The ability to disconnect first and section sections 58 and 60 is facilitated by the fact that the electrical connection between the sections is physically near the feed point for the sections.

Figure 6:
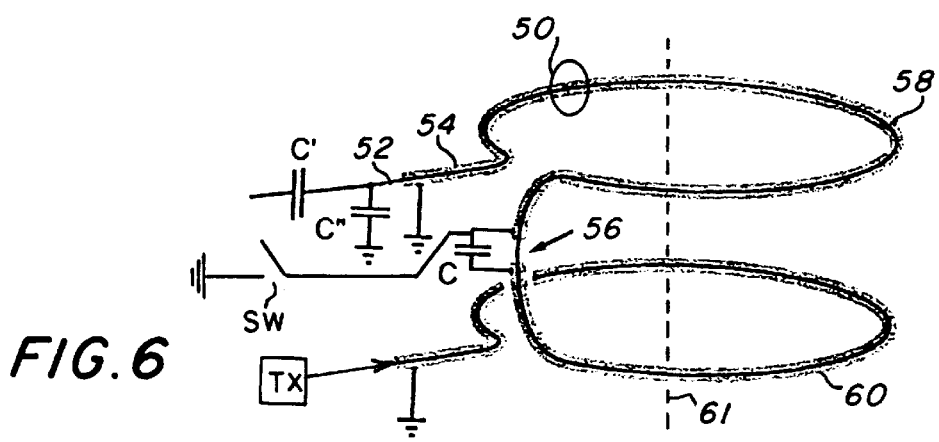
FIG. 6 is a diagram illustrating the use of the coil in FIG. 5 to transmit from only one section, according to an embodiment of the present invention.

FIG. 6 is a diagram illustrating the use of the coil to transmit, according to an embodiment of the present invention. Referring now to FIG. 6, when transmitting, a switch SW is closed to disconnect first section 58, and a transmitter TX provides a signal to second section 60. Alternatively, a switch can be used to disconnect second section 60, while a transmitter provides a signal to first section 58. Therefore, switch SW and transmitter TX together form a transmit mechanism which grounds the shield of one of the sections at the split, and provides a signal to the other section, to use the coil to transmit.

Figure 7:
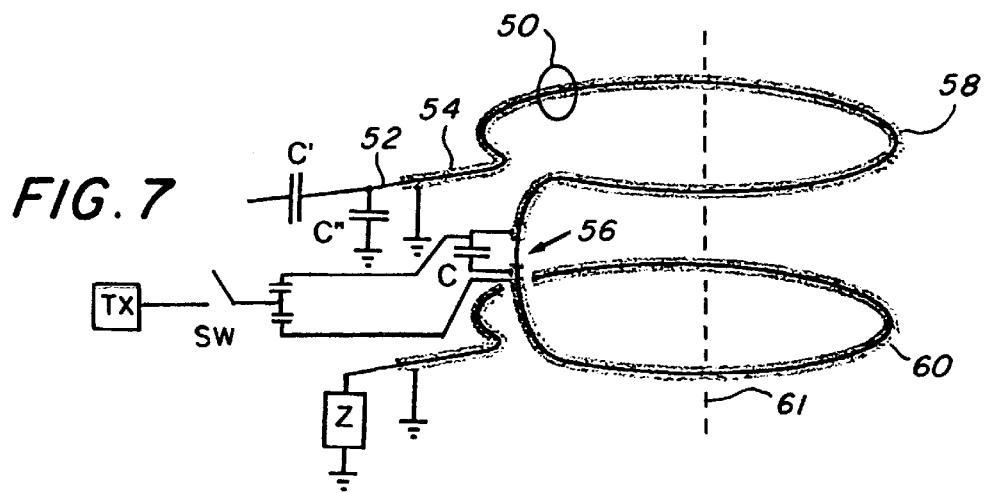
FIG. 7 is a diagram illustrating the use of the coil in FIG. 5 to transmit a more uniform RF field, according to an additional embodiment of the present invention.

FIG. 7 is a diagram illustrating the use of the coil to transmit, according to an additional embodiment of the present invention. Referring now to FIG. 7, capacitors C1 and C2 are across the split in shield 54. To transmit, a transmitter TX provides a signal to a point between capacitors C1 and C2. Therefore, capacitors C1 and C2 and transmitter TX form a transmit mechanism which provides a signal across the split, to use the coil to transmit.

Discrete switches are indicated in FIGS. 6 and 7, however note that those switches in FIGS. 6 and 7 can be implemented with crossed diodes, requiring no external control signals.

There are many different configurations for a transmit mechanism in which the coil in FIG. 5 can be used to both transmit and receive.

Figure 8:
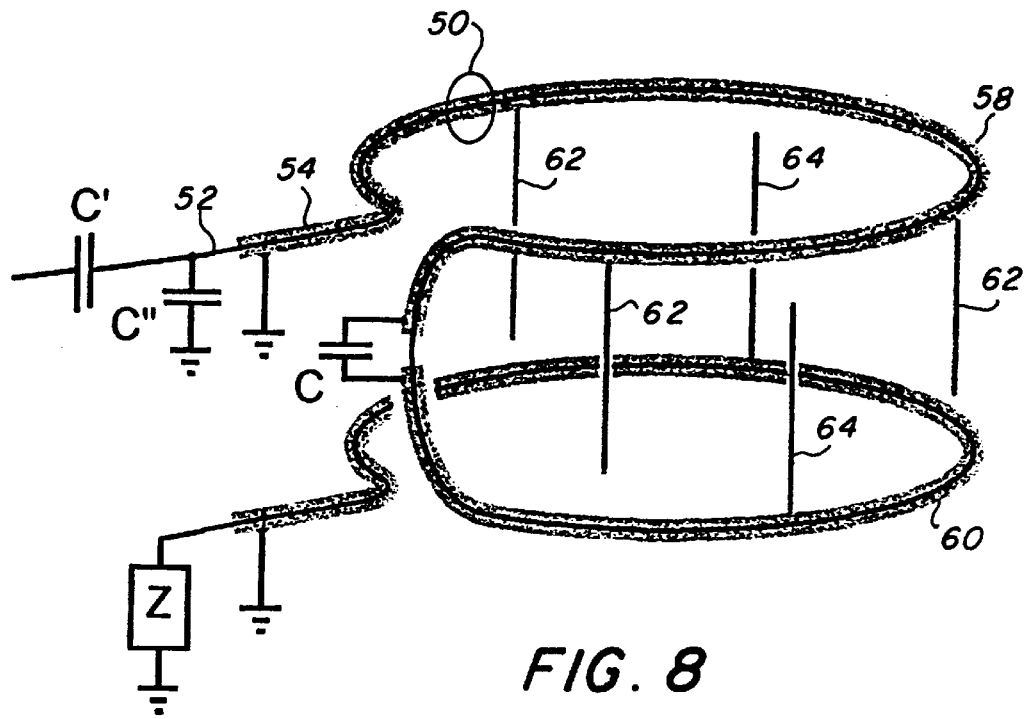
FIG. 8 is a diagram illustrating a noise immune gradiometer split-shield coil having additional electrical shielding, according to an embodiment of the present invention.

FIG. 8 is a diagram illustrating the noise immune gradiometer split-shield coil in FIG. 5, having additional electrical shielding, according to an embodiment of the present invention.

Referring now to FIG. 8, a plurality of electrically conducting strips 62 are electrically connected to first section 58, and a plurality of electrically conducting strips 64 are electrically connected to second section 60, to provide additional electrical shielding. Electrically conducting strips 62 and 64 should be disposed to provide an appropriate additional electrical shielding effect. Therefore, in FIG. 8, electrically conducting strips 62 are directed "downward" from first section 58, and electrically conducting strips 64 are directed "upward" from second section 60, so that the strips lie along the surface of a cylinder defined by the two sections, and so the electrically conducting strips 62 and 64 are interdigitated. The orientation of electrically conducting strips 62 and 64 can easily be determined by a person of skill in the art.

Electrically conducting strips 62 and 64 can be, for example, copper-clad PC board soldered to shield 54.

The use of electrically conducting strips 62 and 64 in FIG. 8 is significantly different than conventional techniques for providing Faraday shielding.

Figure 9:
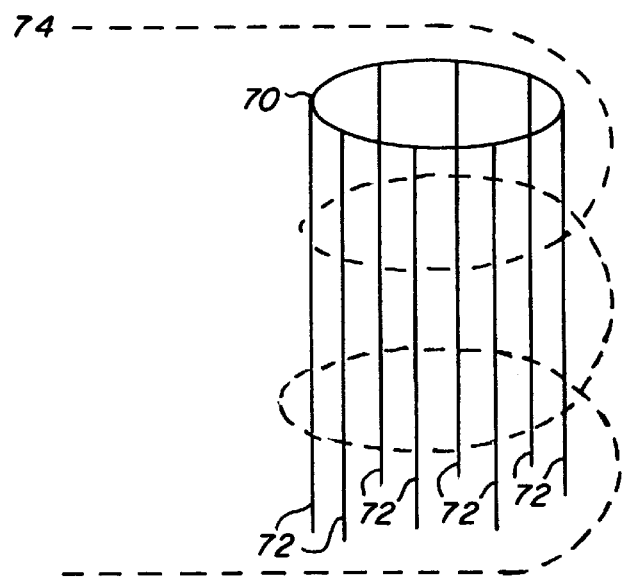
FIG. 9 (prior art) is a diagram illustrating a conventional coil having conventional Faraday shielding.

For example, FIG. 9 is a diagram illustrating a conventional coil having conventional Faraday shielding. Referring now to FIG. 9, a metal wire 70 forms a closed loop. Metal strips 72 are electrically connected to wire 70. Wire 70 with metal strips 72 is then placed inside a coil 74 made of transmission line. Therefore, wire 70 and metal strips 72 form a Faraday shielding device which provide Faraday shielding for coil 74.

Therefore, with additional electrical shielding according to the present invention as illustrated in FIG. 8, electrically conducting strips are attached to the coil to provide additional electrical shielding. By contrast, with conventional Faraday shielding as illustrated in FIG. 9, conducting strips are not attached to the coil, but instead are attached to a metal wire placed inside of the coil.

According to the above embodiments of the present invention, a coil is virtually immune from common environmental noise sources, both electrical and magnetic, and hence eliminates the necessity of providing external RF shielding. This will have utility for NQR detection of explosives and perhaps obviate the need for external RF shielding in magnetic resonance imaging (MRI) applications. In particular, embodiments of the present invention can be applied to the use of NQR to the detection of nitrogenous or chlorine-containing explosives or narcotics carried in luggage, mail, small cargo, on a person, or buried in the ground. More generally, the above embodiments of the present invention can be used for improved detection of any material which has a magnetic resonance response that is unique compared to its surroundings.

Moreover, the above embodiments of the present invention are applicable to many different areas of resonance signal detection. For example, the above embodiments of the present invention are applicable to NMR, NQR, MRI, broad line NMR studies such as stray field imaging of materials and possibly to pulsed Electron Paramagnetic Resonance (EPR) spectrometers using high-Q cavities. Therefore, for example, the embodiments of the present invention are applicable to the detection of NMR resonance signals, NQR resonance signals and EPR resonance signals.

NQR detection systems for the detection of explosives and narcotics, and various NQR concepts, are disclosed, for example, in U.S. patent titled "DETECTION OF EXPLOSIVE AND NARCOTICS BY LOW POWER LARGE SAMPLE VOLUME NUCLEAR QUADRUPOLE RESONANCE (NQR)", U.S. Pat. No. 5,233,300; U.S. patent titled "REMOVING THE EFFECTS OF ACOUSTIC RINGING AND REDUCING TEMPERATURE EFFECTS IN THE DETECTION OF EXPLOSIVES BY NQR", U.S. Pat. No. 5,365,171; U.S. patent titled "DETECTION OF EXPLOSIVES BY NUCLEAR QUADRUPOLE RESONANCE", U.S. Pat. No. 5,206,592; and U.S. patent titled "METHOD AND APPARATUS FOR DETECTING TARGET SPECIES HAVING QUADRUPOLAR NUCLEI BY STOCHASTIC NUCLEAR QUADRUPOLE RESONANCE", U.S. Pat. No. 5,608,321, which are incorporated herein by reference.

A coil according to the above embodiments of the present invention may be specifically useful as a transmitter coil and/or a receiver coil in MRI, NMR, NQR and EPR near electrically conducting media, as described in more detail below.

For rejection of environmental noise, we employ gradiometer designs that are insensitive to the long-wavelength components of the environmental noise. For conducting specimens, we employ coils with a magnetic field that falls off rapidly with distance. (Reciprocity arguments allow us to treat an antenna either as a receiver or a transmitter: a coil that creates a weak field at some point as a transmitter is also less sensitive to pickup from that point.)

A coil according to the above embodiments of the present invention, for which the magnetic field falls off even more rapidly than that of a simple circular loop surface coil, will likely be less sensitive to electrical loss from deep within the sample. While the signal from the coil according to the above embodiments of the present invention is reduced from that of a conventional surface coil, the loss contributions in the coil according to the above embodiments of the present invention will be even less, so that the overall efficiency (in terms of SNR) of such a coil will be better than that of a conventional surface coil for cases where measurements are made near a conducting body.

Furthermore, a similar analysis should hold for a transmitter coil. More specifically, electrical loading of the sample decreases the Q of the transmitter coil and, in this case, increases the RF power required to create an RF magnetic field of a given magnitude. Therefore, it is likely that a transmitter coil according to the above embodiments of the present invention will also be advantageous.

In most NQR, NMR and EPR applications, a common coil would typically be used as both a receiver coil and a transmitter coil, though this is not essential. In MRI separate coils would typically be used.

There are many different types of probe configurations which can use a coil according to the above embodiments of the present invention. Thus, the present invention is not intended to be limited to any specific probe configuration.

Although a few preferred embodiments of the present invention have been shown and described, it would be appreciated by those skilled in the art that changes may be made in these embodiments without departing from the principles and spirit of the invention, the scope of which is defined in the claims and their equivalents.

What is claimed is:

1. A coil comprising:
   a transmission line including a conductor and a shield and having first and second ends, wherein
   the conductor is electrically continuous from the first to the second end, and
   the shield is split at a position between the first and second ends to cause the coil to be electrically balanced and to define first and second sections in series
   and the two sections are geometrically arranged so that a uniform magnetic field through the coil induces currents in each section with the sum of those currents being substantially less than the current flowing in either section.

2. A coil as in claim 1, wherein said sum is less than 10% of the current flowing in either section.

3. A coil as in claim 1, wherein each of the first and second sections is an inductor forming a loop.

4. A coil as in claim 3, wherein each loop is one of the group consisting of a circle shape, an oval shape, a rectangle shape a square shape, and a meanderline.

5. A coil as in claim 1, wherein each of the first and second sections is an inductor forming a loop with a plurality of turns.

6. A coil as in claim 1, wherein the first and second sections together form a magnetic field gradiometer.

7. A coil as in claim 1, wherein the transmission line is a coaxial cable.

8. A coil as in claim 1, further comprising:
   means for providing additional electrical shielding for the coil.

9. A coil as in claim 1, further comprising:
   a first plurality of electrically conducting strips electrically connected to the first section; and
   a second plurality of electrically conducting strips electrically connected to the second section, so that the first and second plurality of strips provide additional electrical shielding.

10. A coil as in claim 1, further comprising:
    a transmit/receive mechanism to switch between a first state where the coil is used to receive, and a second state where the coil is used to transmit.

11. A coil as in claim 1, further comprising:
    a transmit mechanism which grounds the shield of one of the sections at the split and provides a signal to the other section, to use the coil to transmit.

12. A coil as in claim 1, further comprising:
    a transmit mechanism which provides a signal across the split, to use the coil to transmit.

13. A coil as in claim 1, wherein the coil is one of the group consisting of a transmitter coil and a receiver coil.

14. A coil as in claim, 1, wherein the coil is for use in one of the group consisting of Magnetic Resonance Imaging (MRI), Nuclear Magnetic Resonance (NMR), Nuclear Quadrupole Resonance (NQR) and Electron Paramagnetic Resonance (EPR).

15. A coil comprising:
    a transmission line including a conductor and a shield and having first and second ends, wherein
    the transmission line forms first and second loops in series between the first and second ends, the first and second loops together having a geometric configuration so that a uniform magnetic field through the coil induces currents in each loop with the sum of those currents being substantially less than the current flowing in either loop,
    the conductor is electrically continuous from the first to the second end, and
    the shield is split at a position between the first and second loops to cause the coil to be electrically balanced.

16. A coil as in claim 15, wherein said sum is less than 10% of the current flowing in either loop.

17. A coil as in claim 15, wherein each loop has a shape selected from the group consisting of a circle shape, an oval shape, a rectangle shape, a square shape, and a meanderline.

18. A coil comprising:
    a transmission line including a conductor and a shield and configured as a magnetic field gradiometer, wherein
    the conductor is electrically continuous through the coil, and
    the shield is split at a position which causes the gradiometer to be electrically balanced.

19. A coil as in claim 18, wherein the magnetic field gradiometer forms first and second inductors in series, and the shield is split at a position between the first and second inductors.

20. A coil as in claim 18, wherein the magnetic field gradiometer forms two loops in series.

21. A coil as in claim 20, wherein each loop is one of the group consisting of a circle shape, an oval shape, a rectangle shape, a square shape, and a meanderline.

22. A coil as in claim 19, further comprising:
    a first plurality of electrically conducting strips electrically connected to the first inductor; and
    a second plurality of electrically conducting strips electrically connected to the second inductor, so that the first and second plurality of electrically conducting strips provide additional electrical shielding.

23. A coil comprising:
    a transmission line including a conductor and a shield and having first and second ends, wherein
    the conductor is electrically continuous from the first to the second end, and
    the shield is split at a position between the first and second ends to cause the coil to be electrically balanced and to define first and second inductors in series which create fields in the opposite sense.

24. A coil comprising:
    a transmission line forming at least one inductor; and
    a plurality of electrically conducting strips electrically connected to the outside of the inductor, to provide additional electrical shielding, wherein
    the transmission line forms first and second inductors in series,
    a first plurality of electrically conducting strips are electrically connected to the first inductor, and
    a second plurality of electrically conducting strips are electrically connected to the second inductor, so that the first and second plurality of electrically conducting strips provide additional electrical shielding.

* * * * *